US009048447B2

(12) United States Patent
Cho et al.

(10) Patent No.: US 9,048,447 B2
(45) Date of Patent: Jun. 2, 2015

(54) ORGANIC LIGHT EMITTING DISPLAY DEVICE HAVING AUXILIARY CHARGE GENERATION LAYER

(71) Applicant: LG DISPLAY CO., LTD., Seoul (KR)

(72) Inventors: Gwi-Jeong Cho, Daegu (KR); Jae-Man Lee, Seoul (KR); Jeong-Haeng Heo, Paju-si (KR); So-Yeon Ahn, Seoul (KR); Tae-Shick Kim, Yongin-si (KR); Hee-Dong Choi, Uiwang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/062,128

(22) Filed: Oct. 24, 2013

(65) Prior Publication Data

US 2014/0117338 A1 May 1, 2014

(30) Foreign Application Priority Data

Oct. 31, 2012 (KR) .......................... 10-2012-0122577
Jul. 31, 2013 (KR) .......................... 10-2013-0091181

(51) Int. Cl.
| H01L 29/08 | (2006.01) |
| H01L 35/24 | (2006.01) |
| H01L 51/00 | (2006.01) |
| H01L 51/50 | (2006.01) |
| H01L 51/52 | (2006.01) |

(52) U.S. Cl.
CPC ............. *H01L 51/5044* (2013.01); *H01L 51/50* (2013.01); *H01L 51/52* (2013.01); *H01L 51/0054* (2013.01); *H01L 51/506* (2013.01)

(58) Field of Classification Search
CPC ............................... H01L 51/50; H01L 51/52

USPC .............. 257/40, E51.018, E51.019, E51.026
See application file for complete search history.

(56) References Cited

U.S. PATENT DOCUMENTS

| 8,350,257 | B2 * | 1/2013 | Pieh et al. ........................ 257/40 |
| 8,637,858 | B2 * | 1/2014 | Huang et al. ..................... 257/40 |
| 8,766,291 | B2 * | 7/2014 | Forrest et al. .................... 257/89 |
| 8,829,504 | B2 * | 9/2014 | Song et al. ....................... 257/40 |
| 2008/0297036 | A1 | 12/2008 | Noh et al. |
| 2011/0248249 | A1 | 10/2011 | Forrest et al. |
| 2012/0098011 | A1 * | 4/2012 | Choi et al. ....................... 257/98 |
| 2012/0098012 | A1 * | 4/2012 | Kim et al. ........................ 257/98 |
| 2012/0326132 | A1 * | 12/2012 | Ko et al. ........................... 257/40 |
| 2013/0015489 | A1 * | 1/2013 | Song et al. ....................... 257/99 |
| 2013/0285027 | A1 * | 10/2013 | Loebl et al. ...................... 257/40 |

(Continued)

OTHER PUBLICATIONS

Office Action issued in corresponding United Kingdom Patent Application No. GB1318023.7, mailed Mar. 24, 2014, 5 pages.

*Primary Examiner* — Ida M Soward
(74) *Attorney, Agent, or Firm* — Brimks Gilson & Lione

(57) ABSTRACT

An organic light emitting display device with improved lifespan is disclosed. The organic light emitting display device includes first and second electrodes facing each other on a substrate, at least two light emitting units formed between the first and second electrodes, an N-type charge generation layer and a P-type charge generation layer sequentially stacked between the light emitting units, and at least one auxiliary charge generation layer formed between at least any one of the P-type charge generation layer and the N-type charge generation layer and an emitting layer of the light emitting unit disposed on an upper or lower portion of the at least any one thereof and generating electrons and holes supplied to the emitting layer of the light emitting unit.

12 Claims, 16 Drawing Sheets

(56) References Cited

U.S. PATENT DOCUMENTS

2013/0285039 A1* 10/2013 Ishihara et al. ............... 257/40
2013/0306949 A1* 11/2013 Nowatari et al. ............... 257/40
2013/0320837 A1* 12/2013 Weaver et al. ............... 313/504
2014/0084269 A1* 3/2014 Weaver et al. ............... 257/40

* cited by examiner

ORGANIC LIGHT EMITTING DISPLAY DEVICE HAVING AUXILIARY CHARGE GENERATION LAYER This application claims the benefit of priority of Korean Patent Applications No. 10-2012-0122577, filed on Oct. 31, 2012 and No. 10-2013-0091181, filed on Jul. 31, 2013, which is hereby incorporated by reference as if fully set forth herein.

BACKGROUND

1. Field of the Disclosure

The present disclosure relates to an organic light emitting display device with improved lifespan.

2. Discussion of the Related Art

In line with recent information era, display field technology, which visually displays electrical information signals, has rapidly developed. To meet such development, various flat panel display devices with excellent performance, such as ultra-thin in thickness, lightweight, and low power consumption, have been developed.

Examples of flat panel display devices include a liquid crystal display (LCD) device, a plasma display panel (PDP) device, a field emission display (FED) device, an organic light emitting device (OLED), etc.

In particular, OLEDs, which are self-emissive devices, have faster response time, higher luminous efficiency, higher luminance and wider viewing angles than other flat panel display devices.

However, OLEDs have shorter lifespan than other flat panel display devices. Therefore, there is a need to improve OLED lifespan.

SUMMARY

An organic light emitting display device includes first and second electrodes facing each other on a substrate, at least two light emitting units formed between the first and second electrodes, an N-type charge generation layer and a P-type charge generation layer sequentially stacked between the light emitting units, and at least one auxiliary charge generation layer formed between at least any one of the P-type charge generation layer and the N-type charge generation layer and an emitting layer of the light emitting unit disposed on an upper or lower portion of the at least any one thereof and generating electrons and holes supplied to the emitting layer of the light emitting unit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EXEMPLARY EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 1:
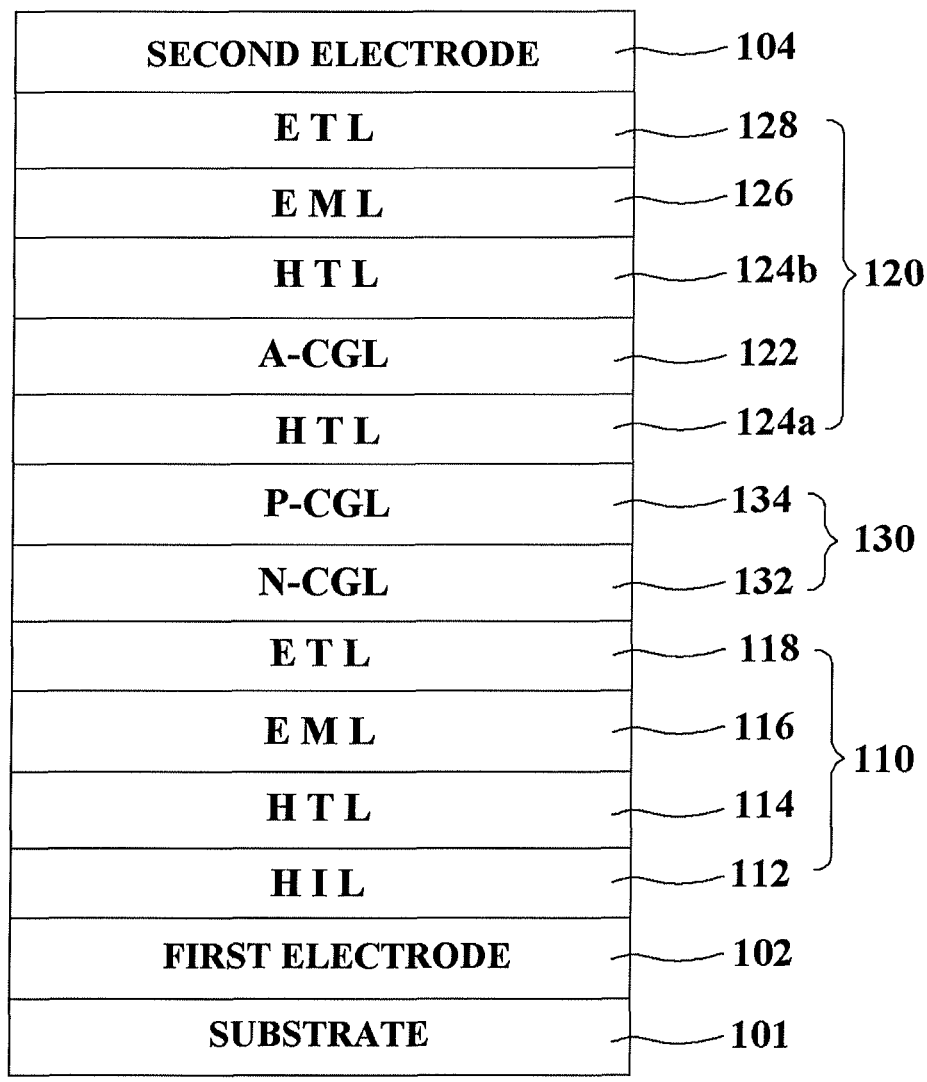
FIG. 1 is a sectional view of an organic light emitting display device according to a first embodiment of the present invention.

FIG. 1 is a sectional view illustrating an organic light emitting display device according to a first embodiment of the present invention.

Referring to FIG. 1, the organic light emitting display device includes first and second electrodes 102 and 104 facing each other, first and second light emitting units 110 and 120 that are disposed between the first and second electrodes 102 and 104, and a charge generation layer 130 disposed between the first and second light emitting units 110 and 120. In the present embodiment, two light emitting units are described by way of example, although three or more light emitting units may be formed.

Any one of the first and second electrodes 102 and 104 is formed as a transparent electrode. When the second electrode 104 is an opaque electrode, the organic light emitting display device is embodied as a bottom emission type that emits light in a bottom direction. When the second electrode 104 is a transparent electrode and the first electrode 102 is an opaque electrode, the organic light emitting display device is embodied as a top emission type that emits light in a top direction. When both the first and second electrodes 102 and 104 are transparent electrodes, the organic light emitting display device is embodied as a dual emission type that emits light in top and bottom directions.

The transparent electrode may be formed of indium tin oxide (ITO), indium zinc oxide (IZO), or the like and the opaque electrode may be formed of aluminum (Al), gold (Au), molybdenum (Mo), chromium (Cr), copper (Cu), LiF, or the like, or a multi-layer structure using these materials may be formed.

In the first embodiment of the present invention, a case in which the first electrode 102 as an anode is formed as a transparent electrode and the second electrode 104 as a cathode is formed as an opaque electrode will be described by way of example.

The first light emitting unit 110 is formed between the first electrode 102 and an N-type charge generation layer 132. The first light emitting unit 110 includes a hole injection layer 112, at least one first hole transport layer 114, a first emitting layer 116, and a first electron transport layer 118 that are sequentially formed on the first electrode 102. The first hole transport layer 114 supplies holes from the first electrode 102 to the first emitting layer 116, the first electron transport layer 118 supplies electrons from the N-type charge generation layer 132 to the first emitting layer 116, and the holes supplied via the first hole transport layer 114 and the electrons supplied via the first electron transport layer 118 are recombined in the first emitting layer 116 and thus light is generated.

The second light emitting unit 120 is formed between the second electrode 104 and a P-type charge generation layer 134. The second light emitting unit 120 includes a second hole transport layer 124a, an auxiliary charge generation layer 122, a third hole transport layer 124b, a second emitting layer 126, and a second electron transport layer 128 that are sequentially formed on the P-type charge generation layer 134.

The second and third hole transport layers 124a and 124b supply holes from the P-type charge generation layer 134 to the second emitting layer 126, the second electron transport layer 128 supplies electrons from the second electrode 104 to the second emitting layer 126, and the holes supplied via the second and third hole transport layers 124a and 124b and the electrons supplied via the second electron transport layer 128 are recombined in the second emitting layer 126 and thus light is generated.

In this regard, the first emitting layer 116 includes a fluorescent blue dopant and host to emit blue light and the second emitting layer 126 includes a phosphorescent yellow-green dopant and host to emit orange light, which enables emission of white light. In addition, white light may be generated using other fluorescent dopants and phosphorescent dopants.

The charge generation layer 130 includes the N-type charge generation layer 132 and the P-type charge generation layer 134 that are sequentially stacked.

The N-type charge generation layer 132 is disposed closer to the first electrode 102 than the P-type charge generation layer 134. The N-type charge generation layer 132 attracts n-type charges (i.e., electrons) separated from an interface between the P-type charge generation layer 134 and the second hole transport layer 124a and an interface between the auxiliary charge generation layer 122 and the third hole transport layer 124a. The N-type charge generation layer 132 is formed by doping alkali metal particles with an organic material.

Figure 2:
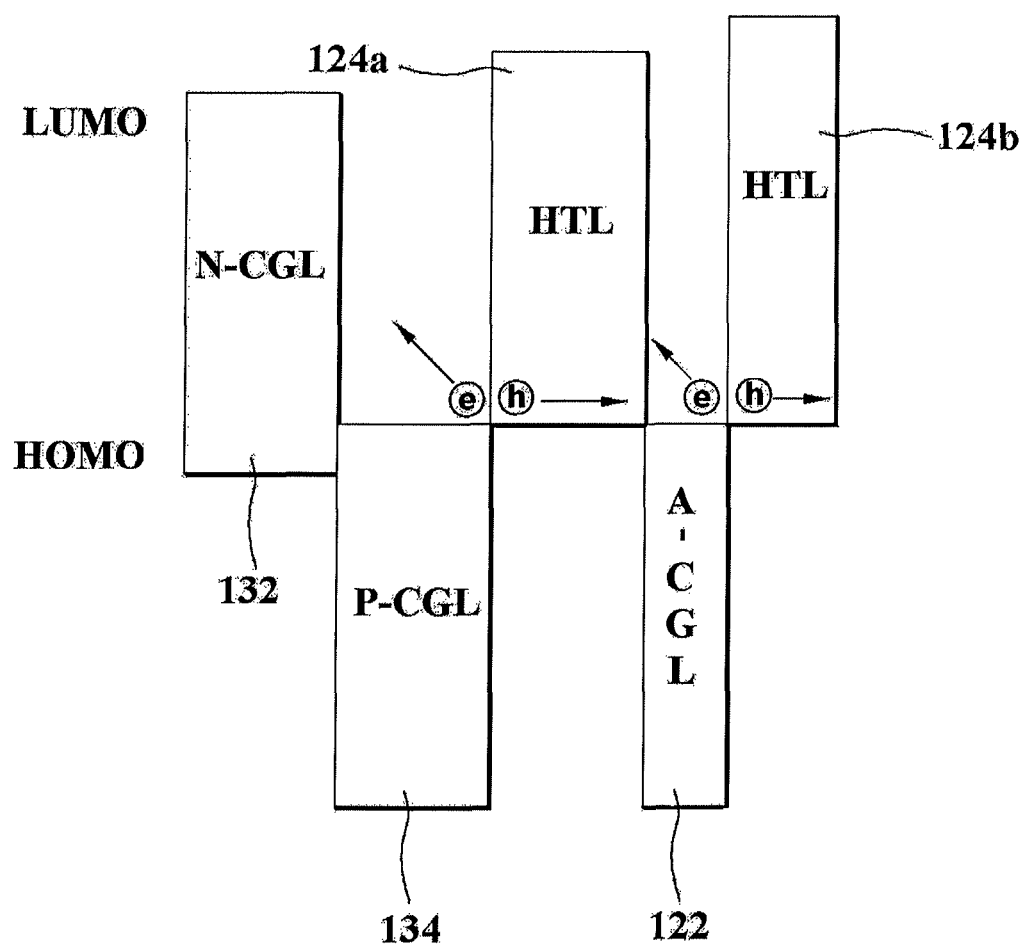
FIG. 2 is a band diagram illustrating the organic light emitting display device illustrated in FIG. 1.

The P-type charge generation layer 134 is disposed closer to the second electrode 104 than the N-type charge generation layer 132. As illustrated in FIG. 2, n-type charges, i.e., electrons, and p-type charges, i.e., holes, are generated and separated at an interface between the P-type charge generation layer 134 and the second hole transport layer 124a and an interface between the auxiliary charge generation layer 122 and the third hole transport layer 124a.

The separated electrons move to the first light emitting unit 110 via the N-type charge generation layer 132 and combine with holes moved from the first electrode 102 in the first emitting layer 116 of the first light emitting unit 110 to form excitons, thereby releasing energy and emitting visible light.

The separated holes move to the second light emitting unit 120 and combine with electrons moved from the second electrode 104 in the second emitting layer 126 to form excitons, thereby releasing energy and emitting visible light.

The auxiliary charge generation layer 122 is formed between the second and third hole transport layers 124a and 124b. The auxiliary charge generation layer 122 generates holes and electrons at an interface between the auxiliary charge generation layer 122 and the third hole transport layer 124b of the second light emitting unit 120. In this regard, the auxiliary charge generation layer 122 is formed farther from the N-type charge generation layer 132 than the P-type charge generation layer 134. Accordingly, the auxiliary charge generation layer 122 may more reduce impact due to cations dissociated from alkali metal particles constituting the N-type charge generation layer 132 than the P-type charge generation layer 134.

In particular, when the alkali metal particles constituting the N-type charge generation layer 132 are dissociated into cations and diffuse into the P-type charge generation layer 134 and the second hole transport layer 124a of the second light emitting unit 120, the P-type charge generation layer 134 and the second hole transport layer 124a are damaged and thus are unable to do function appropriately. In this case, the auxiliary charge generation layer 122 generates holes and electrons at an interface between the auxiliary charge generation layer 122 and the third hole transport layer 124b of the second light emitting unit 120 and supplies the holes to the second emitting layer 126 of the second light emitting unit 120. Accordingly, transfer of holes to the second emitting layer 126 smoothly occurs and thus the ratio of electrons to holes is uniform, which results in sufficient utilization of lifespan of the second emitting layer 126.

The auxiliary charge generation layer 122 is formed of the same material as or a different material from that of the P-type charge generation layer 134.

For example, the auxiliary charge generation layer 122 is formed of an organic material such as 1,4,5,8,9,11-hexaazatriphenylenehexacarbonitrile (HAT-CN). In this regard, HAT-CN has a lower deposition temperature and higher transmissivity than $MoO_3$.

In addition, the auxiliary charge generation layer 122 is formed using a host capable of transporting holes and 1 to 99 wt % of a P-type dopant in combination. In this regard, the amount of the P-type dopant may be in a range of 1 wt % to 30 wt %. The host of the auxiliary charge generation layer 122 is formed of a material that is the same as or different from that of at least one of the second and third hole transport layers 124a and 124b. For example, the host of the auxiliary charge generation layer 122 is formed of at least one of NPB, CBP, NPD, TPD, TBA, and TTA, and the P-type dopant thereof is formed of a material having a lowest unoccupied molecular orbital (LUMO) energy level of −5 eV or less and a molecular weight of 76 or greater. In particular, the P-type dopant is formed of a TNAP derivative (e.g., F4TNAP derivative) represented by Formula 1 below or an organic compound represented by any one of Formulas 2 to 6 below. In Formula 1, R1 to R6 may be substituted or may not be substituted with fluorine or a cyano group.

<Formula 1>

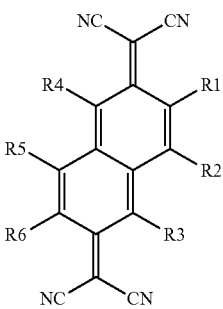

<Formula 2>

1,4-TCAQ

<Formula 3>

6,3-TCPQ

<Formula 4>

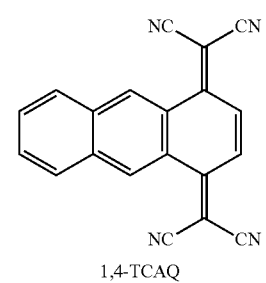

TCAQ

<Formula 5>

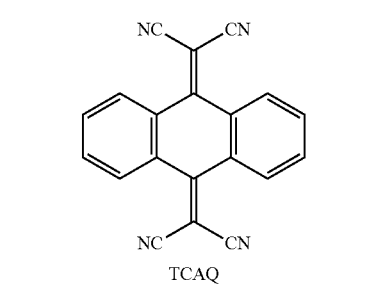

TCNTHPQ

<Formula 6>

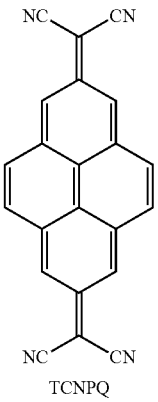

TCNPQ

In this regard, when the auxiliary charge generation layer 122 and the P-type charge generation layer 134 are formed of a host capable of transporting holes and a P-type dopant, the P-type dopant doped in the P-type charge generation layer 134 fills pores of the N-type charge generation layer 132 having a plate structure, whereby surface uniformity may be improved.

Although FIG. 1 illustrates the auxiliary charge generation layer 122 as having a single-layer structure, two or more auxiliary charge generation layers may be formed. For example, as illustrated in FIGS. 3A to 3D, first and second auxiliary charge generation layers 122a and 122b may be formed between the second emitting layer 126 of the second light emitting unit 120 and the P-type charge generation layer 134.

In particular, the first auxiliary charge generation layer 122a generates holes and electrons at an interface between the first auxiliary charge generation layer 122a and the third hole transport layer 124b of the second light emitting unit 120, and the second auxiliary charge generation layer 122b generates holes and electrons at an interface between the second auxiliary charge generation layer 122b and a fourth hole transport layer 124c. In this regard, the first and second auxiliary charge generation layers 122a and 122b are formed farther from the N-type charge generation layer 132 than the P-type charge generation layer 134. Accordingly, the first and second auxiliary charge generation layers 122a and 122b may more reduce impact due to cations dissociated from the alkali metal particles constituting the N-type charge generation layer 132 than the P-type charge generation layer 134.

The first and second auxiliary charge generation layers 122a and 122b may be formed of the same material or different materials.

Figure 3A:
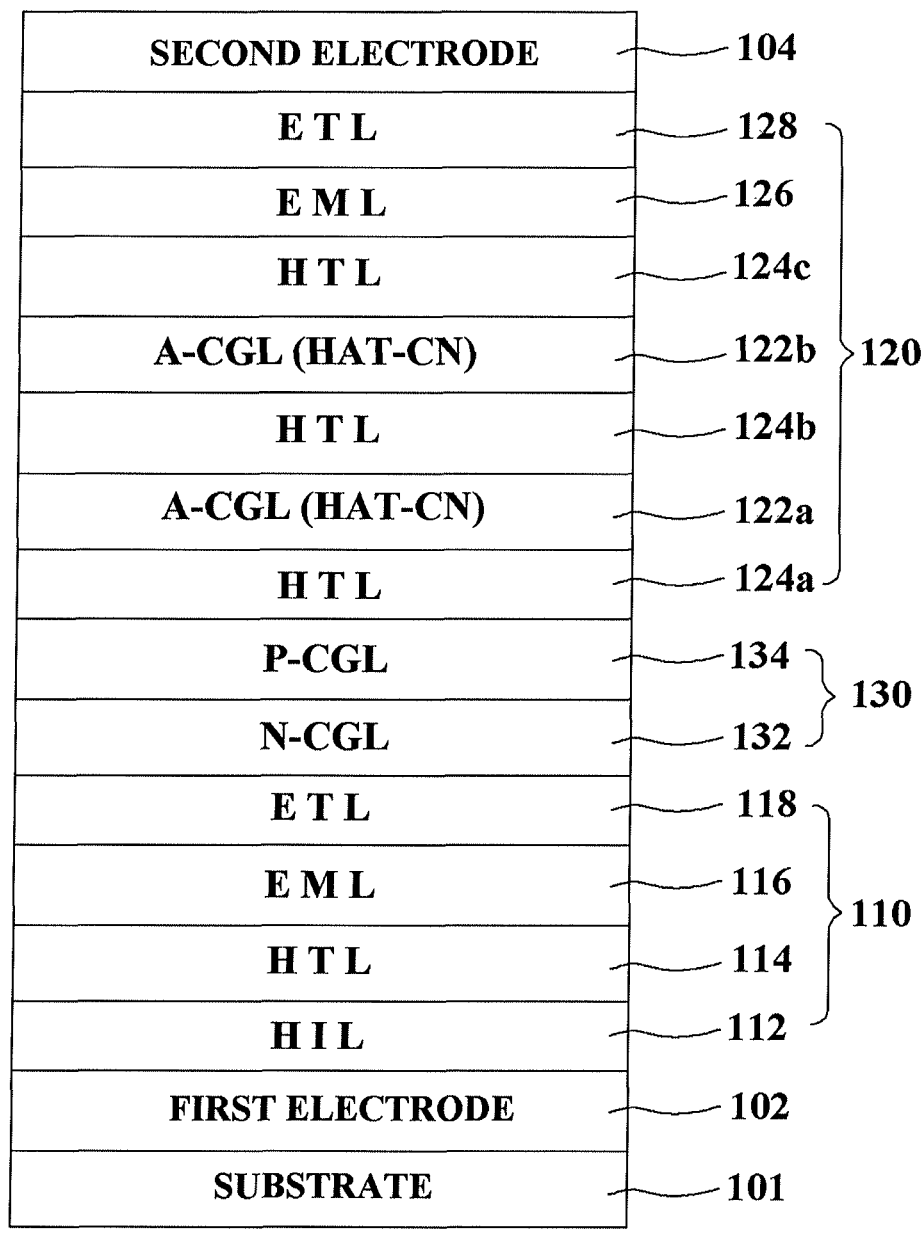
FIGS. 3A to 3D are sectional views illustrating other examples of an auxiliary charge generation layer of the organic light emitting display device according to the first embodiment of the present invention.
Figure 3B:
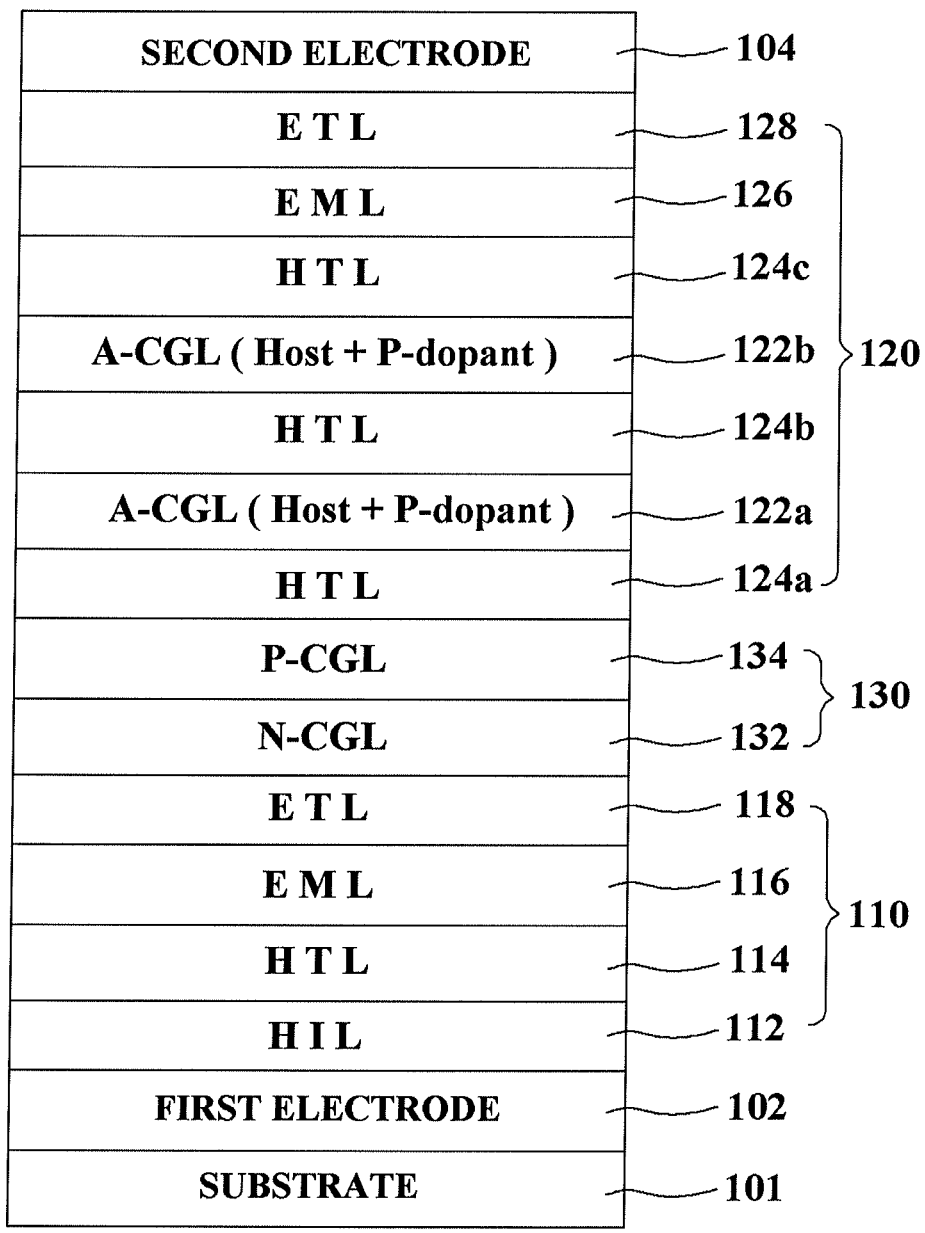

When the first and second auxiliary charge generation layers 122a and 122b are formed of the same material, each of the first and second auxiliary charge generation layers 122a and 122b may be independently formed of HAT-CN as illustrated in FIG. 3A or may be independently formed using a host capable of transporting holes and a P-type dopant of any one of Formulas 1 to 6 in combination as illustrated in FIG. 3B.

In particular, in a structure illustrated in FIG. 3B, host materials of the first and second auxiliary charge generation layers 122a and 122b may be the same or different from those of the second, third and fourth hole transport layers 122a, 122b and 122c, and host materials of the first and second auxiliary charge generation layers 122a and 122b may be the same or different from each other. In addition, the first and second auxiliary charge generation layers 122a and 122b may be doped with the P-type dopant at the same or different doping concentration.

Figure 3C:
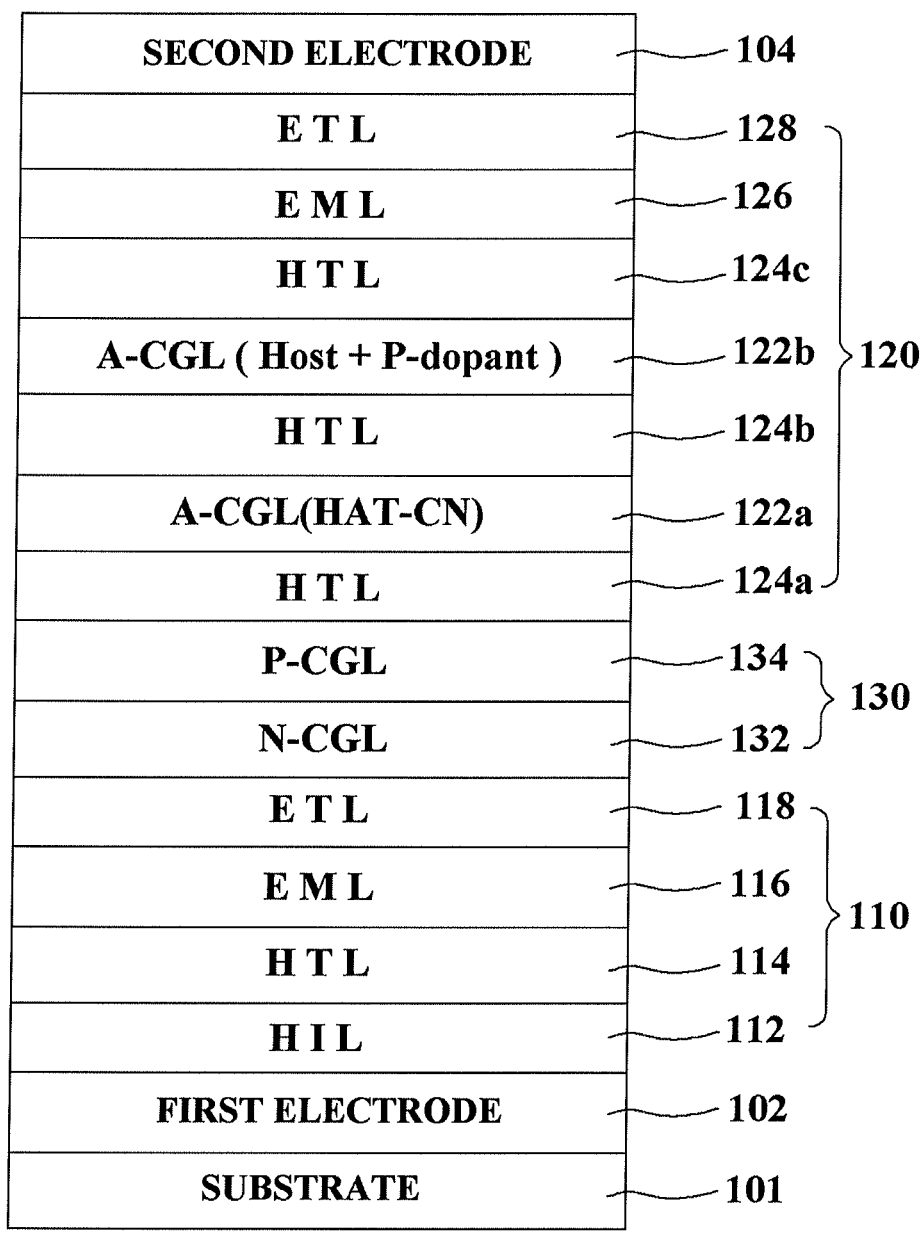
Figure 3D:
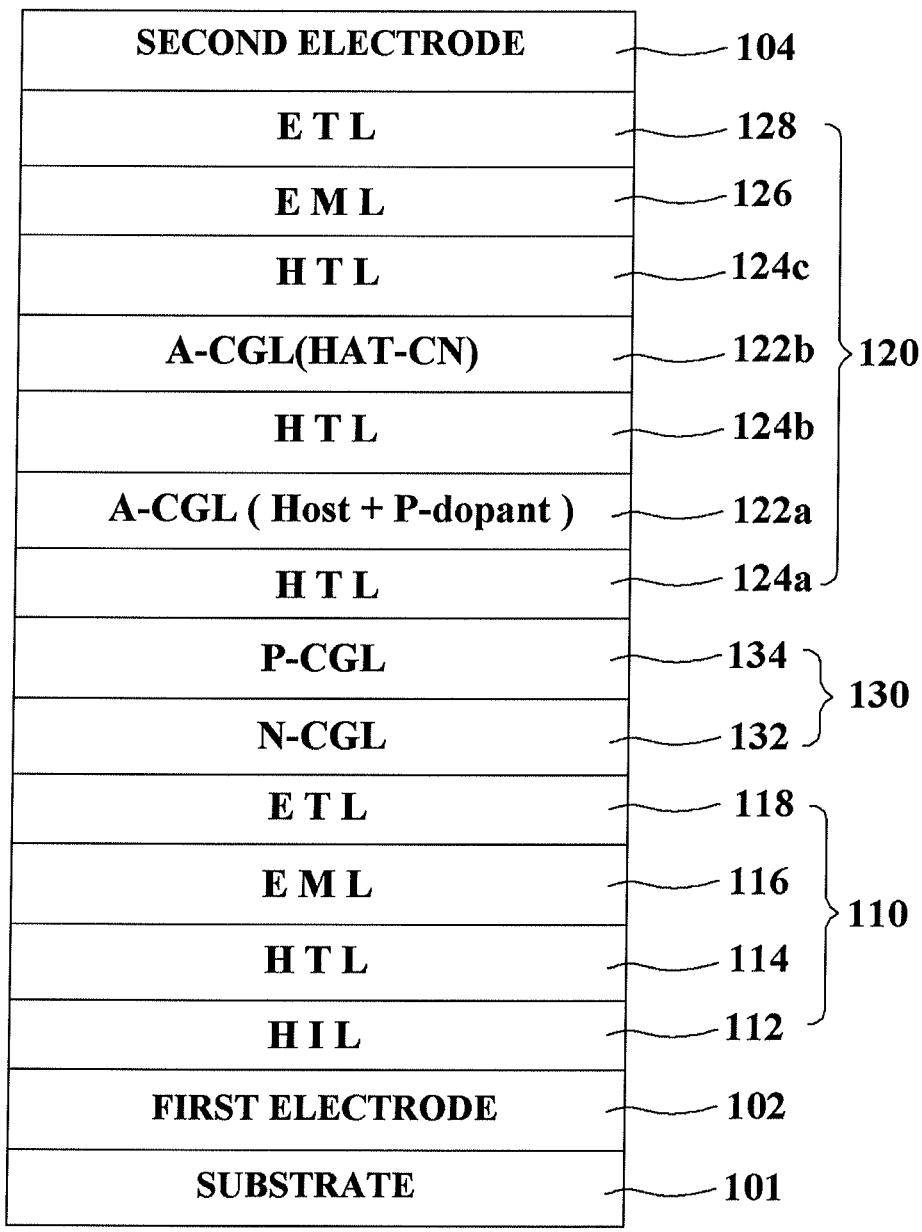

When the first and second auxiliary charge generation layers 122a and 122b are formed of different materials, as illustrated in FIG. 3C, the first auxiliary charge generation layer 122a is formed of HAT-CN and the second auxiliary charge generation layer 122b is formed of a host capable of transporting holes and a P-type dopant of any one of Formulas 1 to 6. In another embodiment, as illustrated in FIG. 3D, the first auxiliary charge generation layer 122a is formed of a host capable of transporting holes and a P-type dopant of any one of Formulas 1 to 6 and the second auxiliary charge generation layer 122b is formed of HAT-CN.

The first and second auxiliary charge generation layers 122a and 122b have a smaller thickness than that of the P-type charge generation layer 134. In particular, a sum of the thicknesses of the first and second auxiliary charge generation layers 122a and 122b is smaller than the thickness of the P-type charge generation layer 134 and thus an overall thickness of the organic light emitting display device is not increased. The sum of the thicknesses of the first and second auxiliary charge generation layers 122a and 122b is the same as the thickness of the auxiliary charge generation layer 122 illustrated in FIG. 1.

Meanwhile, when four or more auxiliary charge generation layers are formed, the overall thickness of the organic light emitting display device increases, which makes it difficult to fabricate an ultra-thin organic light emitting display device. When the auxiliary charge generation layer 122 having a four-layered structure and the hole transport layer 124 having a four-layered structure are formed to a small thickness so as not to cause change in the overall thickness of the organic light emitting display device, working efficiencies of the auxiliary charge generation layer 122 and the hole transport layer 124 are reduced. Thus, the auxiliary charge generation layer 122 may be formed as three or fewer layers in the organic light emitting display device.

Table 1 shows characteristics of a conventional white organic light emitting device (OLED) and a white OLED according to the first embodiment of the present invention.

TABLE 1

| | | 10 mA/cm² | | | | |
|---|---|---|---|---|---|---|
| Conditions | T95 (hour) | Volt (V) | Cd/A | CIE$_x$ | CIE$_y$ | QE (%) |
| Conventional | 3,426 | 7.3 | 80.3 | 0.319 | 0.331 | 33.2 |
| Structure of FIG. 1 | 4,645 to 7,000 | 7.3 | 79.3 | 0.315 | 0.317 | 32.6 |
| Structures of FIGS. 3A to 3D | 4,526 to 7,000 | 7.0 | 78.3 | 0.315 | 0.316 | 32.7 |

In Table 1, the conventional structure does not include an auxiliary charge generation layer, the structure according to the first embodiment of the present invention includes the P-type charge generation layer 134 having a thickness of about 100 Å, the second hole transport layer 124a having a thickness of about 190 Å, the auxiliary charge generation layer 122 having a thickness of about 50 Å, and the third hole transport layer 124b having a thickness of about 150 Å, and the structures including other examples of auxiliary charge generation layers according to the present invention include the P-type charge generation layer 134 having a thickness of about 100 Å, the second hole transport layer 124a having a thickness of about 190 Å, the first auxiliary charge generation layer 122a having a thickness of about 50 Å, the third hole transport layer 124b having a thickness of about 75 Å, the second auxiliary charge generation layer 122b having a thickness of about 50 Å, and the fourth hole transport layer 124c having a thickness of about 75 Å.

Figure 4:
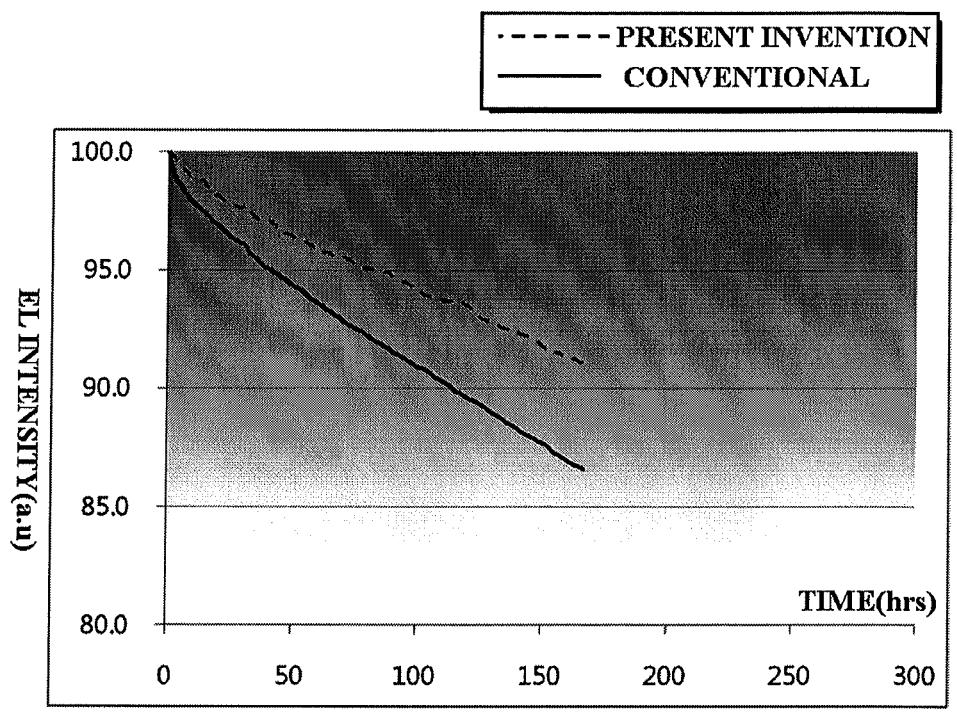
FIG. 4 is a graph for explaining lifespan of a conventional organic light emitting display device and lifespan of the organic light emitting display device according to the first embodiment of the present invention.
Figure 5:
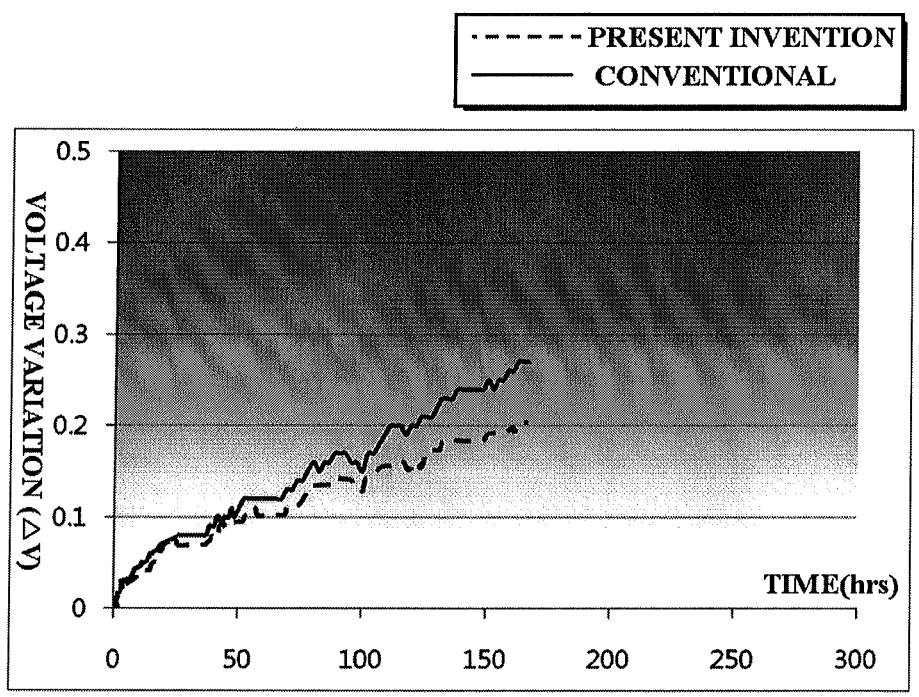
FIG. 5 is a graph for explaining time-voltage variation of each of the conventional organic light emitting display device and the organic light emitting display device according to the first embodiment of the present invention.

In Table 1, T95 denotes the time required for the white OLED to reach 95% of total lifespan. As shown in Table 1 and FIG. 4, a conventional white OLED has a T95 of 3,426 hours, while the white OLED according to the present invention has a T95 between 4,526 and 7,000 hours. In addition, as illustrated in FIG. 5, the organic light emitting display device according to the present invention has lower voltage variation over time than a conventional organic light emitting display device and thus may stably supply current. That is, it can be confirmed that the white OLED according to the present invention has longer lifespan than a conventional white OLED.

Figure 6A:
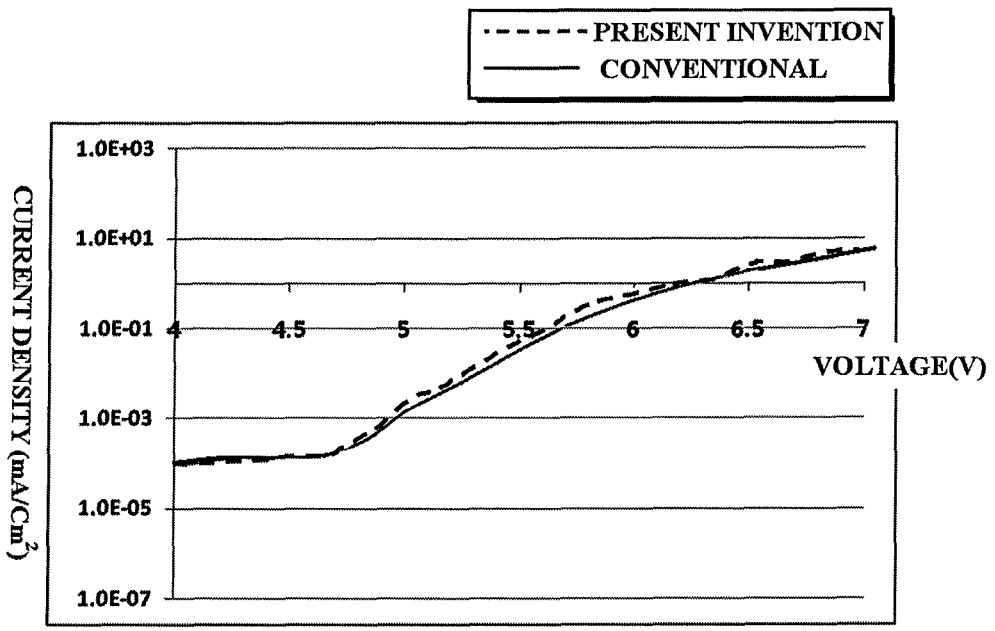
FIGS. 6A and 6B are graphs for explaining voltage-current density of each of the conventional organic light emitting display device and the organic light emitting display device according to the first embodiment of the present invention.
Figure 6B:
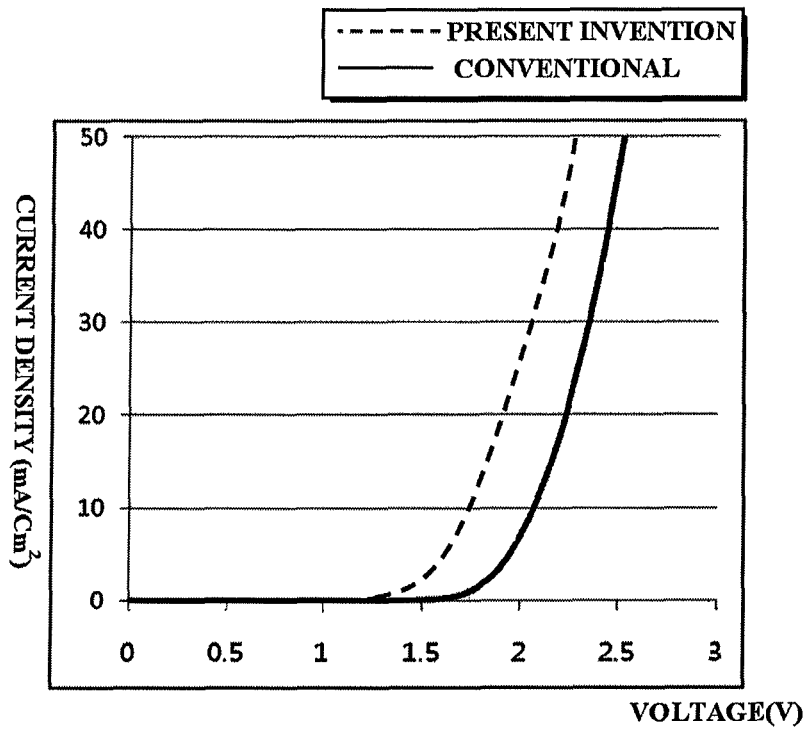

As illustrated in FIGS. 6A and 6B, it can be confirmed that the organic light emitting display device according to the present invention has higher current density according to voltage than a conventional organic light emitting display device and thus driving voltage for the same current density is low. In particular, from the results shown in Table 1, it can be confirmed that a driving voltage of the structure including the first and second auxiliary charge generation layers 122a and 122b is lower than that of the structure including the auxiliary charge generation layer 122.

That is, as shown in Table 1 and FIGS. 4 to 6B, it can be confirmed that the organic light emitting display device according to the present invention has higher driving voltage (V), higher efficiency (cd/A), improved color coordinates (CIE$_x$, CIE$_y$), and higher quantum efficiency (QE), when compared to a conventional white organic light emitting display device.

Figure 7:
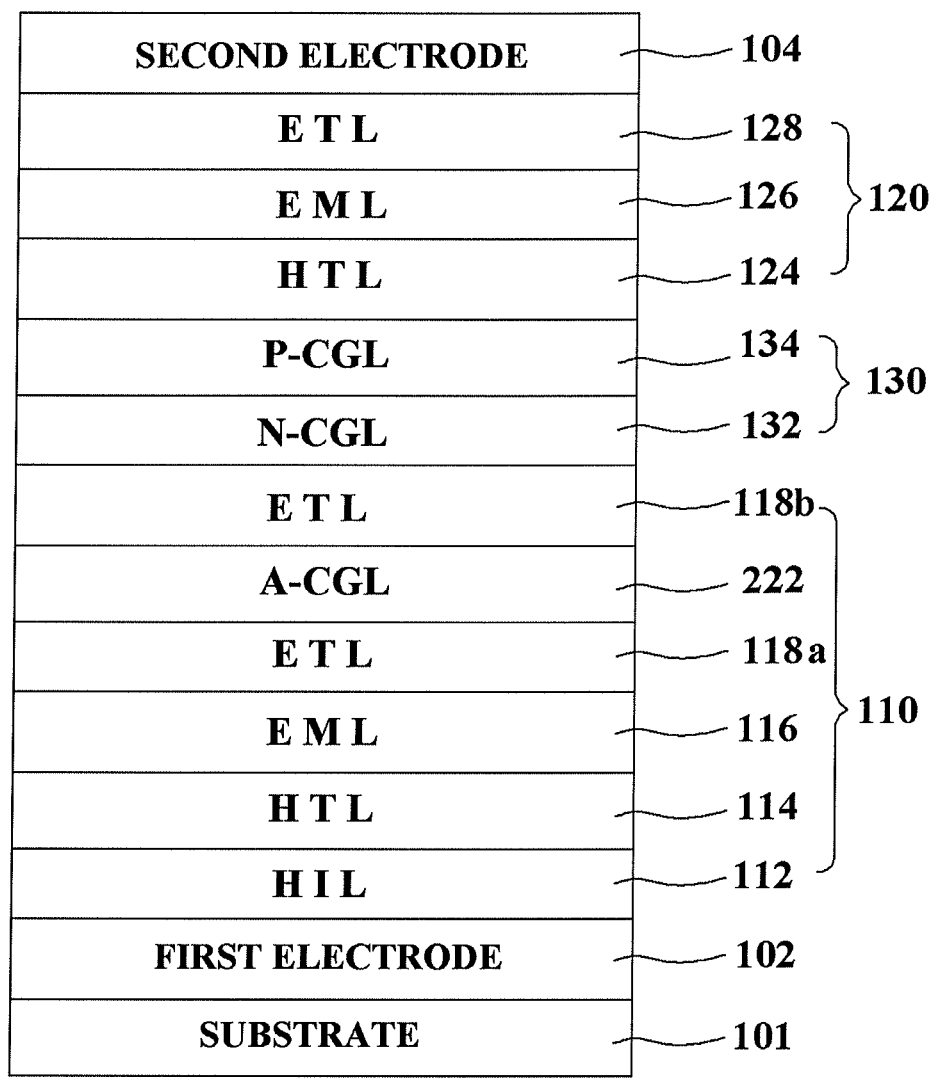
FIG. 7 is a sectional view of an organic light emitting display device according to a second embodiment of the present invention.

FIG. 7 is a sectional view of an organic light emitting display device according to a second embodiment of the present invention.

The organic light emitting display device illustrated in FIG. 7 includes the same elements as those of the organic light emitting display device illustrated in FIG. 1, except that an auxiliary charge generation layer 222 is formed between electron transport layers 118a and 118b. Thus, a detailed description of the same elements will be omitted.

Figure 8:
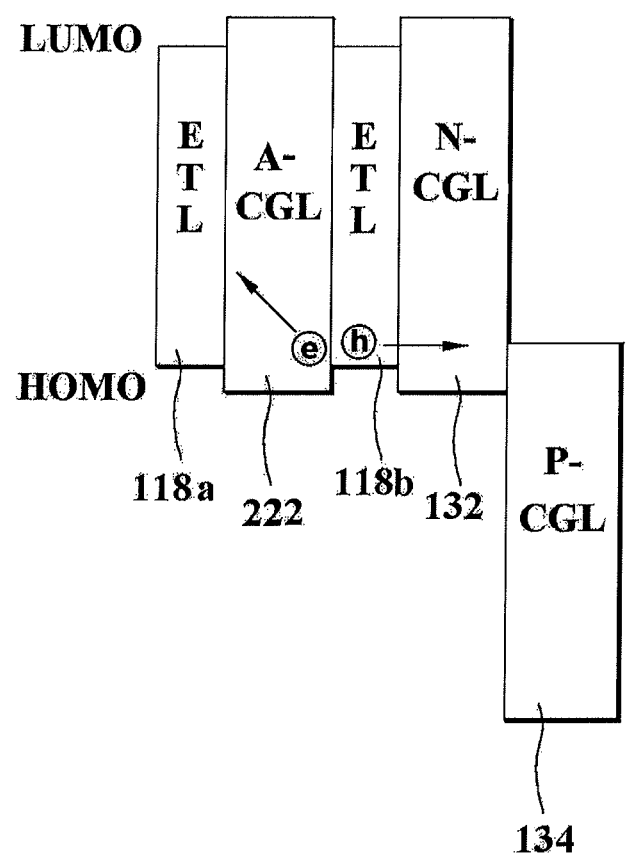
FIG. 8 is a band diagram illustrating the organic light emitting display device illustrated in FIG. 7.

As illustrated in FIG. 8, the auxiliary charge generation layer 222 generates and separates n-type charges, i.e., electrons, and p-type charges, i.e., holes, at an interface between the auxiliary charge generation layer 222 and the electron transport layer 118a and an interface between the auxiliary charge generation layer 222 and the electron transport layer 118b. Accordingly, the auxiliary charge generation layer 222 may prevent ionization of an alkali metal constituting the N-type charge generation layer 132.

In particular, when the alkali metal constituting the N-type charge generation layer 132 is ionized over time, the N-type charge generation layer 132 cannot serve function appropriately. In this case, the auxiliary charge generation layer 222 generates holes and electrons at interfaces between each of the electron transport layers 118a and 118b and the auxiliary charge generation layer 222 and supplies the electrons to the first emitting layer 116 of the first light emitting unit 110. When the electrons are smoothly transferred to the first emitting layer 116, the amounts of holes and electrons become uniform and thus increase in voltage while the organic light emitting display device operates may be suppressed, and resistance thereof is reduced, which results in improved lifespan.

The auxiliary charge generation layer 222 is formed of a material that is the same or different from that of the N-type charge generation layer 132. For example, each of the auxiliary charge generation layer 222 and the N-type charge generation layer 132 is formed of a metal and an organic compound.

In this regard, the organic compound has a fused aromatic ring with 15 to 40 carbon atoms, a substituent of which has at least one selected from among N, S, and O. In particular, the organic compound has a LUMO energy level of −2.0 eV or less and a bandgap of 2.5 eV or more. Preferably, the organic compound has a LUMO energy level between −3.0 and −2.0 eV and a bandgap between 2.5 and 3.5 eV. For example, the organic compound is formed of tris(8-hydroxyquinoline)aluminum ($Alq_3$), 2,9-dimethyl-4,7-diphenyl-1,10-phenanthroline (BCP), 4,7-diphenyl-1,10-phenanthroline (Bphen), 2,2'-[1,1'-biphenyl]-4,4'-diylbis[4,6-(p-tolyl)-1,3,5-triazine] (TRAZ), or a combination thereof.

As the metal, an alkali metal or an alkali earth metal is used. For example, Ca, Li, Mg, Cs, or the like may be used as the metal.

In this regard, a doping amount of the alkali metal or the alkali earth metal is 1% to 10% based on the volume of the N-type charge generation layer 132.

In addition, the auxiliary charge generation layer 222 has the same thickness as that of the N-type charge generation layer 132 or has a smaller thickness than that of the N-type charge generation layer 132. When the auxiliary charge generation layer 222 has a greater thickness than that of the N-type charge generation layer 132, the amount of the metal included in the auxiliary charge generation layer 222 increases and thus ion diffusion of the metal increases, which results in damage to the emitting layer 116. When the auxiliary charge generation layer 222 is formed to a very small thickness so as not to cause change in the overall thickness of the organic light emitting display device, working efficiency of the auxiliary charge generation layer 222 is reduced, which results in decreased lifespan thereof.

Table 2 shows characteristics of a conventional white organic light emitting display device and a white OLED according to the second embodiment of the present invention.

TABLE 2

| Conditions | T80 (hrs) @50 mA/$Cm^2$ | ΔV @T95 |
|---|---|---|
| Conventional | 330 | 0.2 |
| Structure including a single auxiliary charge generation layer | 390 | 0.1 |
| Structure including two auxiliary charge generation layers | 420 | 0.1 |

Figure 9:
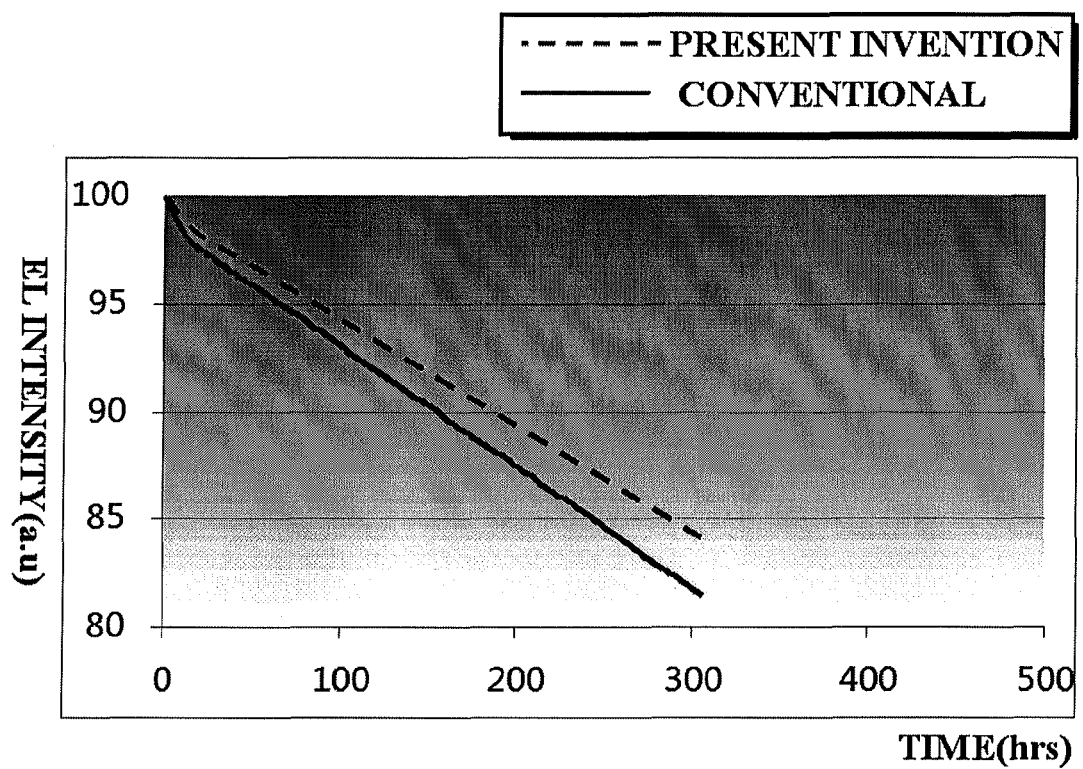
FIG. 9 is a graph for explaining lifespan of the conventional organic light emitting display device and lifespan of the organic light emitting display device according to the second embodiment of the present invention.
Figure 10:
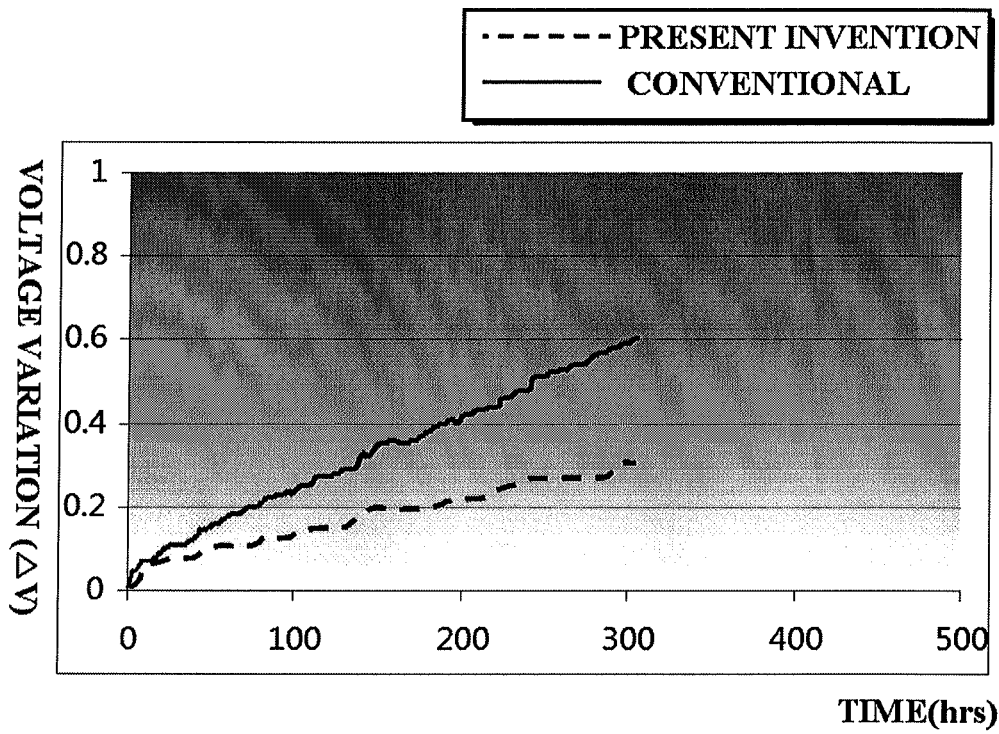
FIG. 10 is a graph for explaining time-voltage variation of the conventional organic light emitting display device and the organic light emitting display device according to the second embodiment of the present invention.

In Table 2, T80 denotes the time required for the white OLED to reach approximately 80% of total lifespan, and T95 denotes the time required for the white OLED to reach approximately 95% of total lifespan. As shown in Table 2 and FIG. 9, the conventional white OLED has a T80 of about 330 hours, while the white OLED according to the second embodiment including a single auxiliary charge generation layer has a T80 of about 390 hours and the white OLED according to the second embodiment including two auxiliary charge generation layers has a T80 of about 420 hours. In addition, as shown in Table 2 and FIG. 10, the white organic light emitting display device according to the second embodiment of the present invention has lower voltage variation over time than the conventional organic light emitting display device and thus may stably supply current, which results in improved lifespan.

Figure 11A:
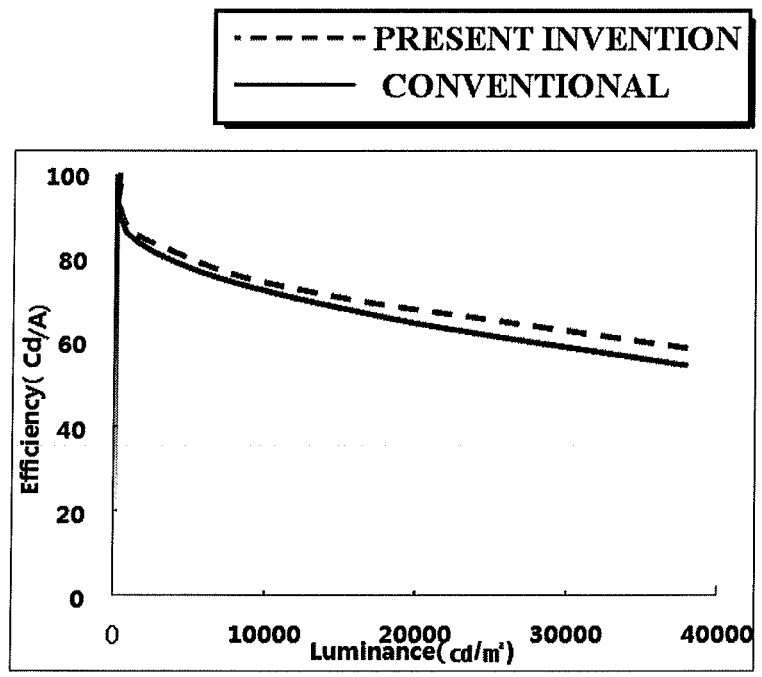
FIGS. 11A and 11B are graphs for explaining voltage-current density-luminance characteristics of the conventional organic light emitting display device and the organic light emitting display device according to the second embodiment of the present invention.
Figure 11B:
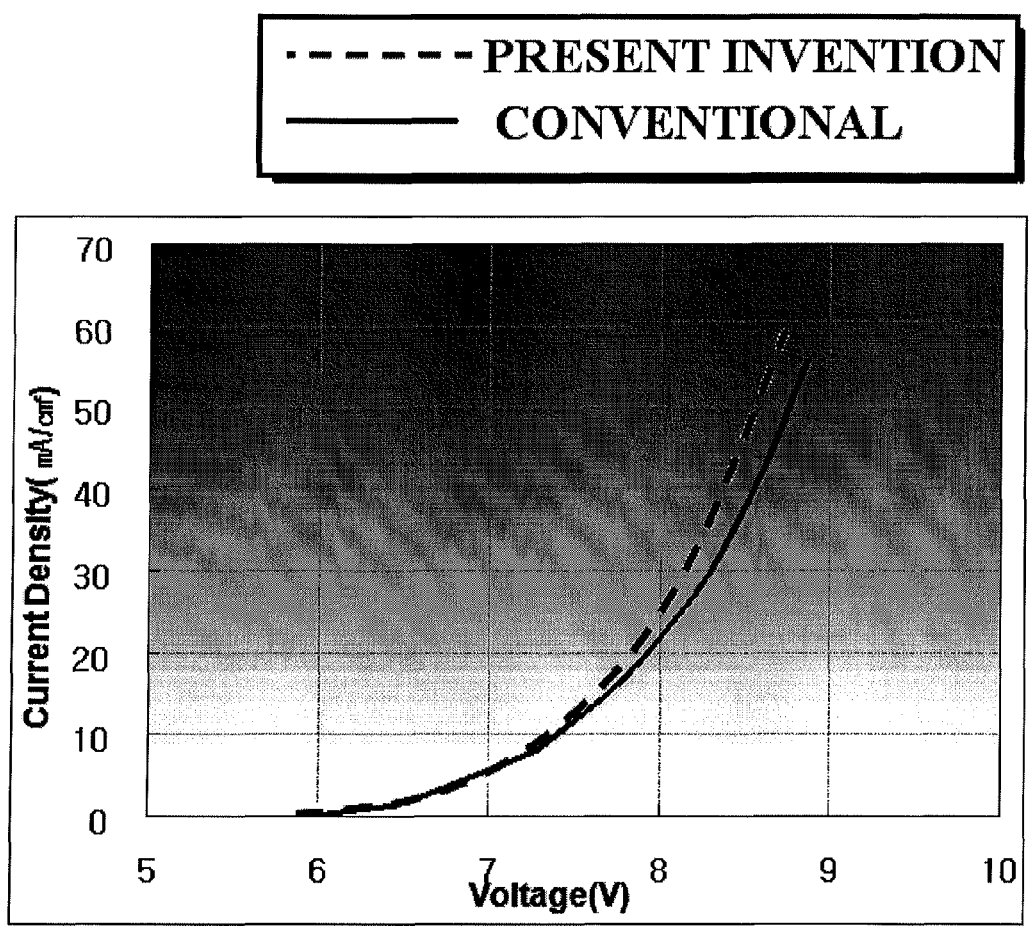

In addition, as illustrated in FIG. 11A, the organic light emitting display device according to the present invention has similar current efficiency vs. luminance to that of the conventional organic light emitting display device, while, as illustrated in FIG. 11B, the organic light emitting display device according to the second embodiment of the present invention has higher current density according to voltage than the conventional organic light emitting display device and thus driving voltage for the same current density of the organic light emitting display device according to the second embodiment of the present invention is lower than that of the conventional organic light emitting display device.

Figure 12:
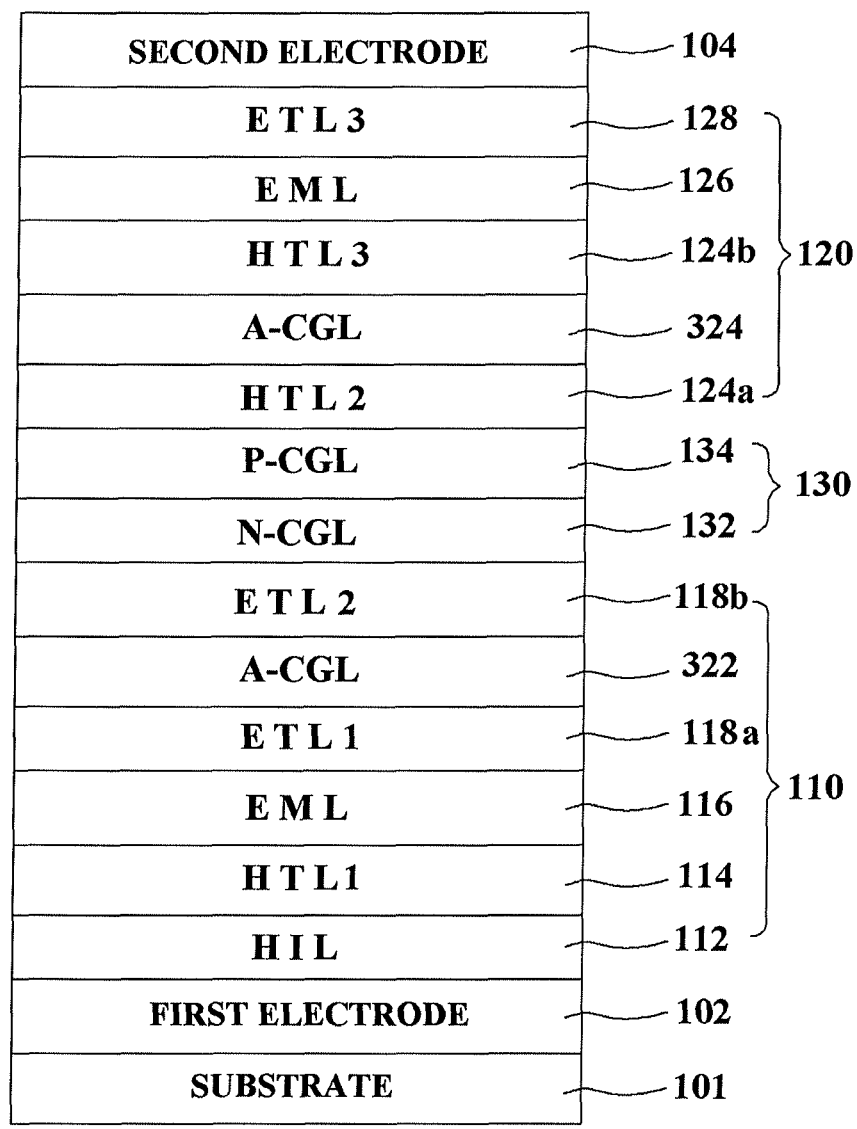
FIG. 12 is a sectional view of an organic light emitting display device according to a third embodiment of the present invention.

FIG. 12 is a sectional view of an organic light emitting display device according to a third embodiment of the present invention.

The organic light emitting display device illustrated in FIG. 12 includes the same elements as those of the organic light emitting display device illustrated in FIG. 1, except that auxiliary charge generation layers 322 and 324 are formed between first and second electron transport layers 118a and 118b and between second and third hole transport layers 124a and 124b, respectively. Thus, a detailed description of the same elements will be omitted.

Auxiliary charge generation layers illustrated in FIG. 12 consist of a first auxiliary charge generation layer 322 formed between the first and second electron transport layers 118a and 118b and a second auxiliary charge generation layer 324 formed between the second and third hole transport layers 124a and 124b.

Figure 13:
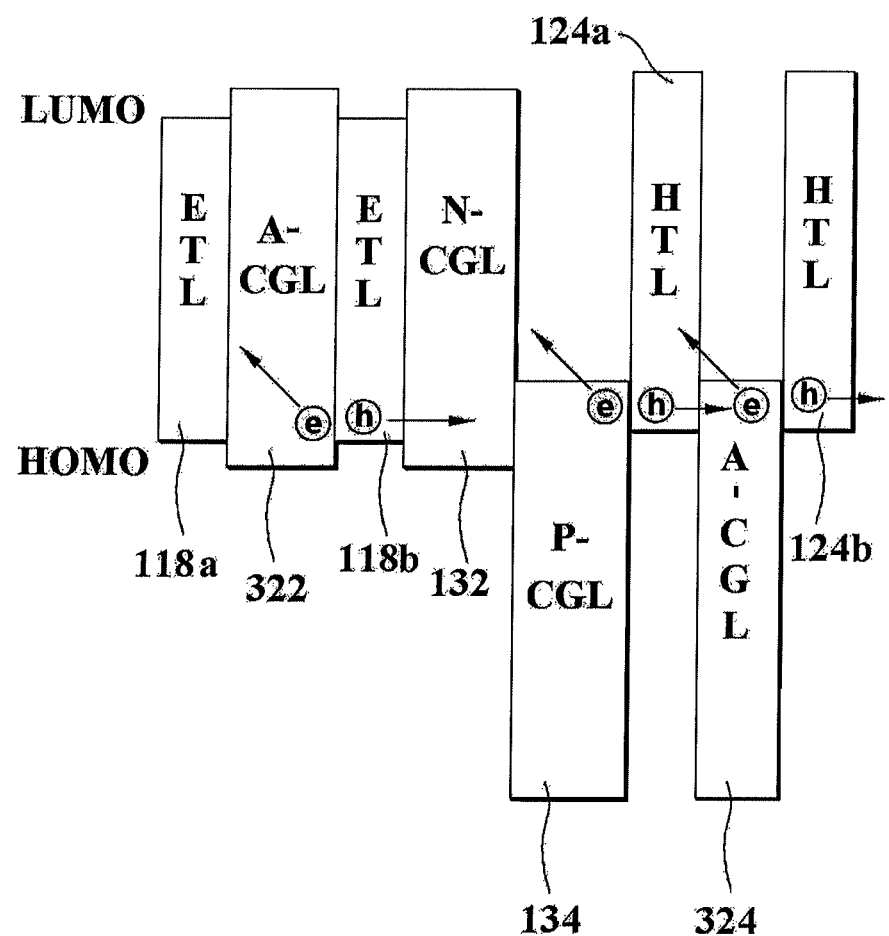
FIG. 13 is a band diagram illustrating the organic light emitting display device illustrated in FIG. 12.

As illustrated in FIG. 13, the first auxiliary charge generation layer 322 generates holes and electrons at interfaces between the first auxiliary charge generation layer 322 and each of the first and second electron transport layers 118a and 118b and supplies the electrons to the first emitting layer 116 of the first light emitting unit 110. When the electrons are smoothly transferred to the first emitting layer 116, the amounts of holes and electrons become uniform and thus increase in voltage while the organic light emitting display device operates may be suppressed, and resistance thereof is reduced, which results in improved lifespan.

The first auxiliary charge generation layer 322 is formed of the same or different material from that of the N-type charge generation layer 132. For example, the first auxiliary charge generation layer 322 is formed of the same material as that of the auxiliary charge generation layer 222 illustrated in the second embodiment of the present invention. In addition, the first auxiliary charge generation layer 322 has the same thickness as that of the N-type charge generation layer 132 or has a smaller thickness than that of the N-type charge generation layer 132 so that the overall thickness of the organic light emitting display device does not increase.

The second auxiliary charge generation layer 324 is formed between the second and third hole transport layers 124a and 124b. As illustrated in FIG. 13, the second auxiliary charge generation layer 324 generates holes and electrons at an interface between the second auxiliary charge generation layer 324 and the third hole transport layer 124b of the second light emitting unit 120 and supplies the holes to the second emitting layer 126 of the second light emitting unit 120. Accordingly, the holes are smoothly transferred to the second emitting layer 126 and thus the ratio of the electrons to the holes is uniform, which enables lifespan of the second emitting layer 126 to be fully utilized.

The second auxiliary charge generation layer 324 is formed of the same or different material from that of the P-type charge generation layer 134. For example, the second auxiliary charge generation layer 324 is formed of the same material as that of the auxiliary charge generation layer 122 illustrated in the first embodiment of the present invention. In addition, the second auxiliary charge generation layer 324 has the same thickness as that of the P-type charge generation layer 134 or has a smaller thickness than that of the P-type charge generation layer 134.

Figure 14:
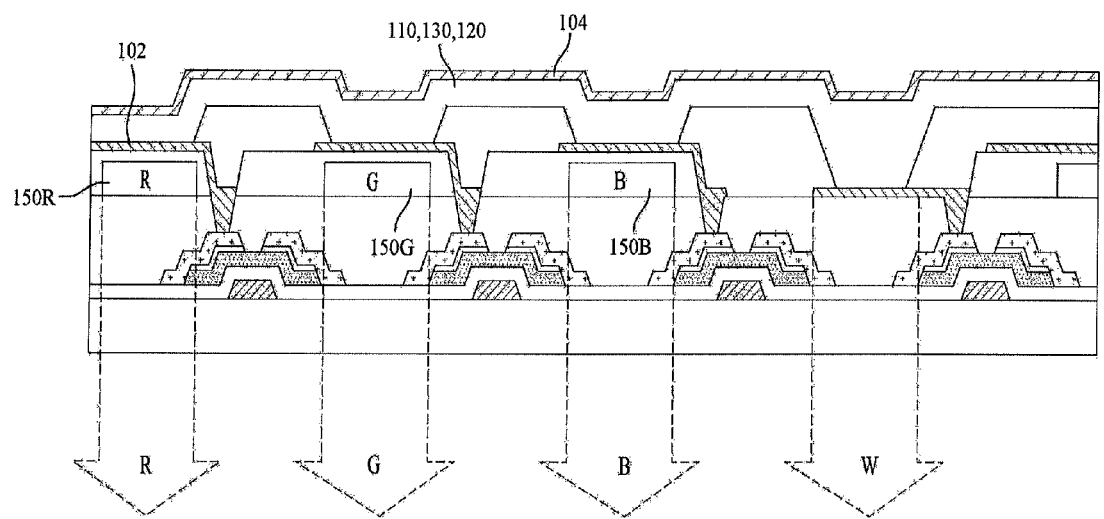
FIG. 14 is a sectional view of the organic light emitting display device according to one of the first, second and third embodiments of the present invention having color filters.

The organic light emitting display devices according to the first, second and third embodiments of the present invention may also be applied to a structure including red, green and blue color filters 150R, 150G and 150B as illustrated in FIG. 14. That is, white light generated via the first and second light emitting units is emitted as red light while passing through a sub-pixel region provided with the red color filter 150R, is emitted as green light while passing through a sub-pixel region provided with the green color filter 150G, is emitted as blue light while passing through a sub-pixel region provided with the blue color filter 150B, and is emitted unchanged while passing through a sub-pixel region not provided with a color filter.

As is apparent from the foregoing description, an organic light emitting display device according to the present invention includes at least any one of a P-type charge generation layer and an N-type charge generation layer and at least one auxiliary charge generation layer disposed between emitting layers of corresponding light emitting units and generating holes and electrons. Accordingly, holes and electrons generated via the auxiliary charge generation layer may be stably supplied to the emitting layers, whereby lifespan of the organic light emitting display device may be increased by approximately 35% when compared to lifespan of a conventional organic light emitting display device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
   first and second electrodes facing each other on a substrate;
   at least two light emitting units formed between the first and second electrodes, wherein each of the light emitting units comprises an emitting layer;
   an N-type charge generation layer and a P-type charge generation layer sequentially stacked between the light emitting units; and
   a first auxiliary charge generation layer generating electrons and holes supplied to the emitting layer of the light emitting unit,
   wherein the first auxiliary charge generation layer is formed either between the P-type charge generation layer and the emitting layer of the light emitting unit disposed above the P-type charge generation layer, or between the N-type charge generation layer and the emitting layer of the light emitting unit disposed below the N-type charge generation layer.

2. The organic light emitting display device according to claim 1, wherein the at least two light emitting units comprises:
   a first light emitting unit comprising a hole injection layer, a first hole transport layer, a first emitting layer, and a first electron transport layer, the layers being stacked between the first electrode and the N-type charge generation layer; and
   a second light emitting unit comprising a second hole transport layer, the first auxiliary charge generation layer, a third hole transport layer, a second emitting layer, and a second electron transport layer, the layers being stacked between the P-type charge generation layer and the second electrode.

3. The organic light emitting display device according to claim 2, wherein:
   the P-type charge generation layer comprises a host capable of transporting holes and 1 to 99 wt % of a p-type dopant in combination or comprises HAT-CN, and
   the host comprises a material that is the same or different from that of at least any one of the second and third hole transport layers.

4. The organic light emitting display device according to claim 1, wherein the device comprises the first auxiliary charge generation layer and a second auxiliary charge generation layer, and
   the at least two light emitting units comprise:
   a first light emitting unit comprising a hole injection layer, a first hole transport layer, a first emitting layer, and a first electron transport layer, the layers being stacked between the first electrode and the N-type charge generation layer; and
   a second light emitting unit comprising a second hole transport layer, the first auxiliary charge generation layer, a third hole transport layer, the second auxiliary charge generation layer, a fourth hole transport layer, a second emitting layer, and a second electron transport layer, the layers being stacked between the P-type charge generation layer and the second electrode.

5. The organic light emitting display device according to claim 4, wherein:
   each of the first auxiliary charge generation layer and the second auxiliary charge generation layer comprises a material that is the same or different from that of the P-type charge generation layer, and
   the P-type charge generation layer comprises a host capable of transporting holes and 1 to 99 wt % of a p-type dopant in combination or comprises HAT-CN.

6. The organic light emitting display device according to claim 5, wherein, when the first auxiliary charge generation layer and the second auxiliary charge generation layer comprise the host capable of transporting holes and the p-type dopant in combination, the host comprises the same material as that of at least any one of the second, third and fourth hole transport layer.

7. The organic light emitting display device according to claim 3, wherein the p-type dopant comprises an organic compound represented by any one of Formulas 1 to 6 below where R1 to R6 are substituted or unsubstituted with fluorine or cyano group:

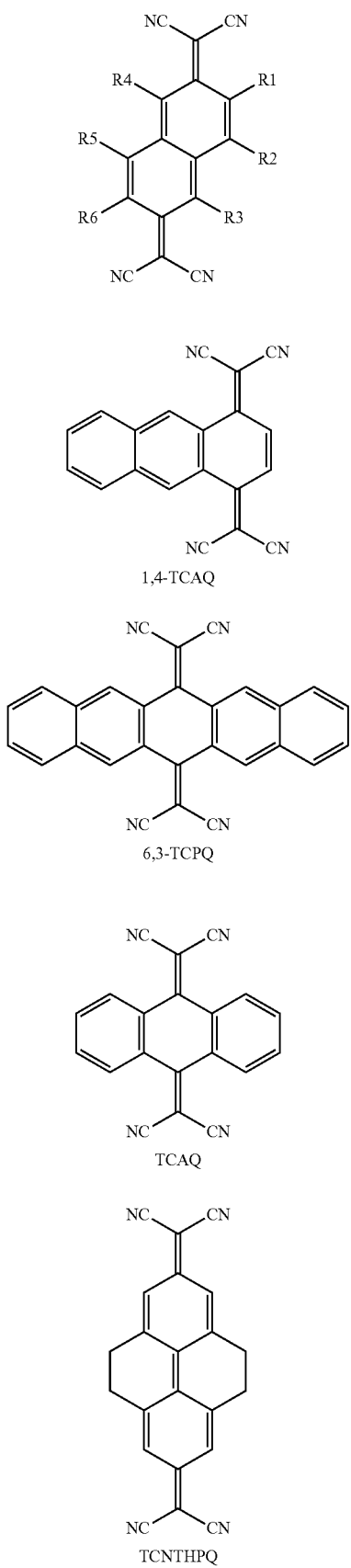

<Formula 1>

<Formula 2> 1,4-TCAQ

<Formula 3> 6,3-TCPQ

<Formula 4> TCAQ

<Formula 5> TCNTHPQ

<Formula 6> TCNPQ

8. The organic light emitting display device according to claim 3, wherein the P-type charge generation layer comprises the host capable of transporting holes and 1 to 30 wt % of the p-type dopant.

9. The organic light emitting display device according to claim 1, wherein the at least two light emitting units comprise:
 a first light emitting unit comprising a hole injection layer, a first hole transport layer, a first emitting layer, a first electron transport layer, the first auxiliary charge generation layer, and a second electron transport layer, the layers being stacked between the first electrode and the N-type charge generation layer; and
 a second light emitting unit comprising a second hole transport layer, a second emitting layer, and a third electron transport layer, the layers being stacked between the P-type charge generation layer and the second electrode.

10. The organic light emitting display device according to claim 9, wherein the first auxiliary charge generation layer comprises a material that is the same or different from that of the N-type charge generation layer and has a thickness that is the same as or smaller than that of the N-type charge generation layer.

11. The organic light emitting display device according to claim 1, wherein the device comprises the first auxiliary charge generation layer and a second auxiliary charge generation layer, and
 wherein the at least two light emitting units comprise:
 a first light emitting unit comprising a hole injection layer, a first hole transport layer, a first emitting layer, a first electron transport layer, the first auxiliary charge generation layer and a second electron transport layer, the layers being stacked between the first electrode and the N-type charge generation layer; and
 a second light emitting unit comprising a second hole transport layer, the second auxiliary charge generation layer, a third hole transport layer, a second emitting layer, and a third electron transport layer, the layers being stacked between the P-type charge generation layer and the second electrode.

12. The organic light emitting display device according to claim 9, wherein the first auxiliary charge generation layer comprises a material that is the same or different from that of the N-type charge generation layer and has a thickness that is the same as or smaller than that of the N-type charge generation layer, and the second auxiliary charge generation layer comprises a material that is the same or different from that of the P-type charge generation layer and has a thickness that is the same as or smaller than that of the P-type charge generation layer.

* * * * *